(12) United States Patent
Lee et al.

(10) Patent No.: US 6,184,096 B1
(45) Date of Patent: Feb. 6, 2001

(54) SEMICONDUCTOR PROCESSING METHOD OF PROVIDING DOPANT IMPURITY INTO A SEMICONDUCTOR SUBSTRATE

(75) Inventors: Roger R. Lee; Charles H. Dennison, both of Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/276,976

(22) Filed: Mar. 26, 1999

Related U.S. Application Data

(63) Continuation of application No. 08/964,929, filed on Nov. 5, 1997, now Pat. No. 5,904,532.

(51) Int. Cl.[7] .................................................. H01L 21/336
(52) U.S. Cl. ........................................ 438/298; 438/297
(58) Field of Search .................................... 438/297–298, 438/322, 377, 299–307

(56) References Cited

U.S. PATENT DOCUMENTS

| | | | |
|---|---|---|---|
| 4,607,429 | 8/1986 | Kosonocky | 29/572 |
| 4,994,407 | 2/1991 | Custode et al. | 437/70 |
| 5,004,701 | 4/1991 | Motokawa | 437/47 |
| 5,075,242 | 12/1991 | Nakahara | 437/34 |
| 5,382,820 | 1/1995 | Yang et al. | 257/371 |
| 5,393,693 | 2/1995 | Ko et al. | 437/69 |

*Primary Examiner*—Charles Bowers
*Assistant Examiner*—Craig Thompson
(74) *Attorney, Agent, or Firm*—Wells, St. John, Roberts, Gregory & Matkin, P.S.

(57) ABSTRACT

A semiconductor processing method of providing dopant impurity into a semiconductor substrate includes: a) providing a semiconductor substrate, the substrate comprising a first bulk region having a blanket doping of a first conductivity type dopant, the substrate comprising a second bulk region having a blanket doping of a second conductivity type dopant; b) defining field oxide regions and active area regions in each of the first and second bulk substrate regions; c) in the same masking step, masking active area regions of the first bulk substrate region while leaving field oxide regions of the first bulk substrate region unmasked and masking field oxide regions of the second bulk substrate region while leaving select active area regions of the second bulk substrate region unmasked; and d) in the same ion implanting step, ion implanting first conductivity type impurity through the unmasked portions of the first and second bulk substrate regions to simultaneously form channel stop isolation implants beneath the unmasked field oxide regions in the first bulk substrate region and electrically conductive active area implants in the unmasked active area regions of the second bulk substrate region.

8 Claims, 11 Drawing Sheets

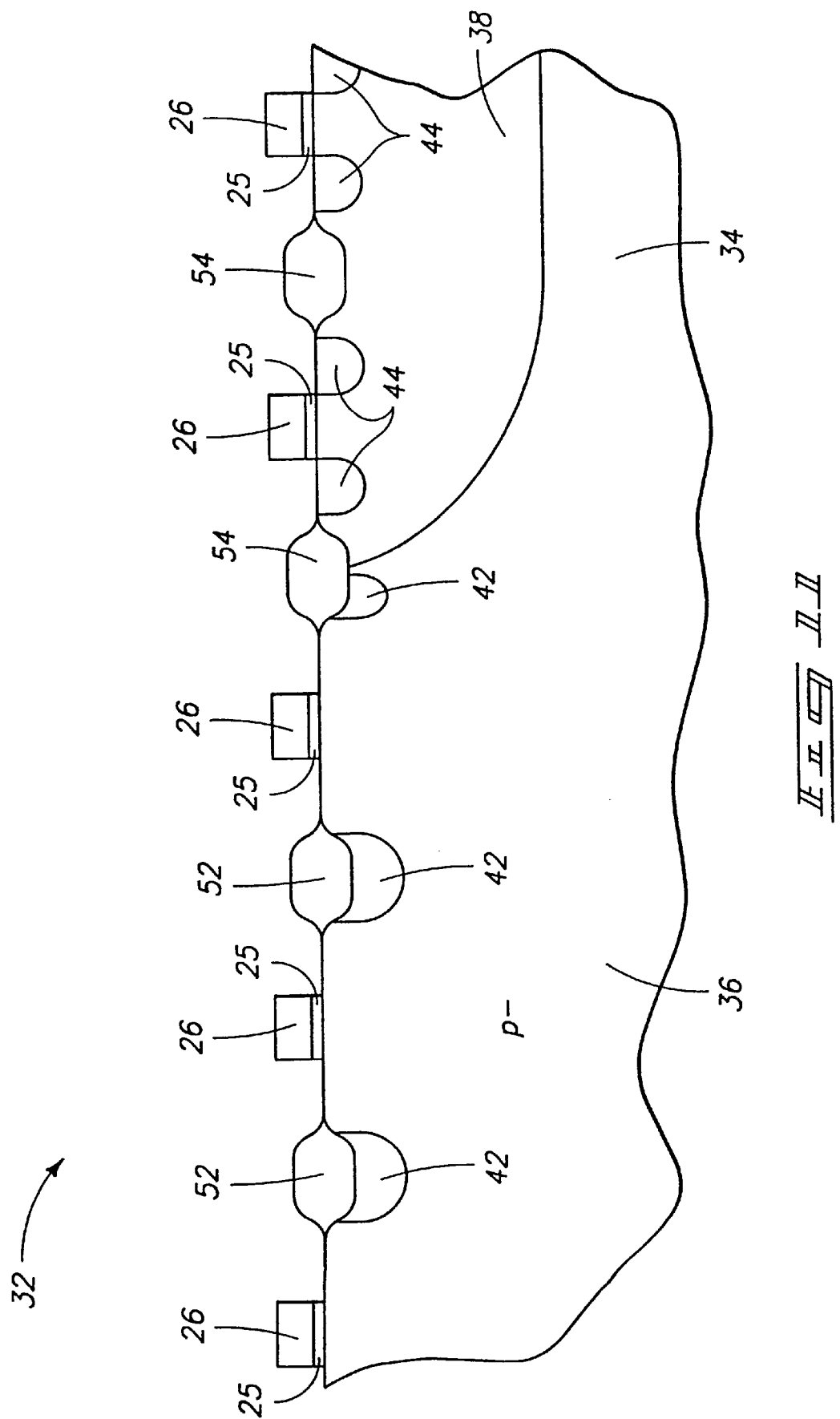

SEMICONDUCTOR PROCESSING METHOD OF PROVIDING DOPANT IMPURITY INTO A SEMICONDUCTOR SUBSTRATE

RELATED PATENT DATA

This patent application is a continuation resulting from U.S. patent application Ser. No. 08/964,929, which was a continuation application filed on Nov. 5, 1997, now U.S. Pat. No. 5,904,532; which resulted from a continuation application which is now U.S. Pat. No. 5,700,730, issued Dec. 23, 1997; which resulted from U.S. Pat. No. 5,494,851, issued Feb. 27, 1996.

TECHNICAL FIELD

This invention relates to semiconductor processing methods of providing dopant impurity into a semiconductor substrate.

BACKGROUND OF THE INVENTION

Integrated circuit density continues to increase thereby requiring tighter (smaller) device-to-device spacing. In addition, MOS gate channel lengths are scaling down for both higher performance and greater packing density.

One of the primary methods utilized in achieving such scaling is to reduce the junction depth of the source/drain regions and increase the substrate or well background dopant concentration. However, the reduction of the source/drain depth and increase of the background well concentration will lead to more abrupt source/drains, and lead to lower breakdown voltage between the active area and well. In some circuits, this reduction of breakdown voltage is not acceptable. One way of increasing the breakdown voltage between the active area and substrate is to add a deeper implant into selected active areas to grade the junction.

BRIEF DESCRIPTION OF THE DRAWINGS

Preferred embodiments of the invention are described below with reference to the following accompanying drawings.

FIG. 11 is a view of the FIG. 7 wafer at a processing step subsequent to that shown by FIG. 10.

DETAILED DESCRIPTION OF THE PREFERRED EMBODIMENTS

Figure 1:
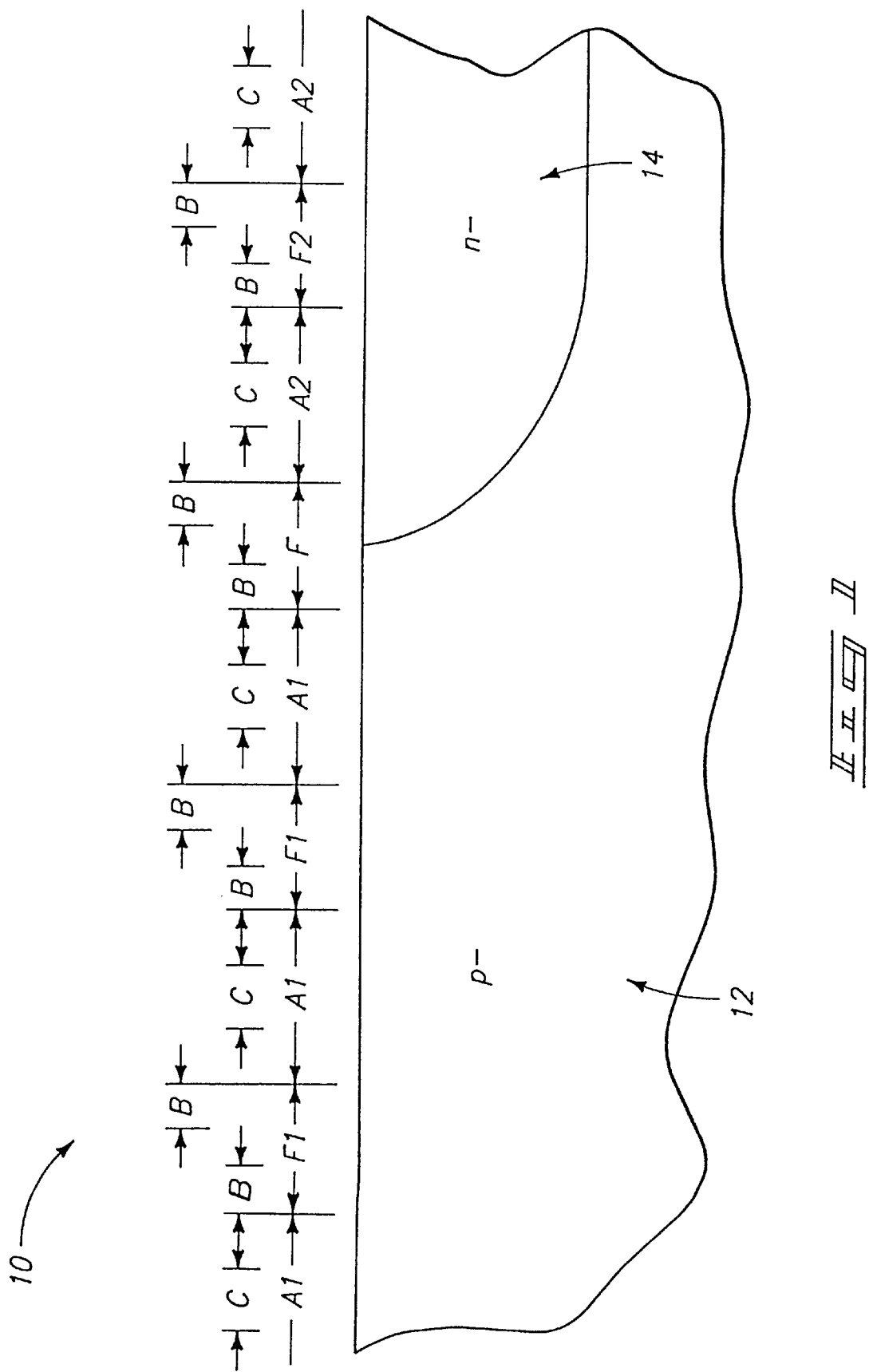
FIG. 1 is a diagrammatic sectional view of a wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of providing dopant impurity into a semiconductor substrate comprising the following steps:

providing a semiconductor substrate, the substrate comprising a first bulk region having a blanket doping of a first conductivity type dopant, the substrate comprising a second bulk region having a blanket doping of a second conductivity type dopant;

defining field oxide regions and active area regions in each of the first and second bulk substrate regions;

in the same masking step, masking active area regions of the first bulk substrate region while leaving field oxide regions of the first bulk substrate region unmasked and masking field oxide regions of the second bulk substrate region while leaving select active area regions of the second bulk substrate region unmasked; and in the same ion implanting step, ion implanting first conductivity type impurity through the unmasked portions of the first and second bulk substrate regions to simultaneously form channel stop isolation implants beneath the unmasked field oxide regions in the first bulk substrate region and electrically conductive active area implants in the unmasked select active area regions of the second bulk substrate region.

In accordance with another and narrower aspect of the invention, a semiconductor processing method of providing dopant impurity into a semiconductor substrate comprising the following sequential steps:

providing a semiconductor substrate, the substrate comprising a first bulk region having a blanket doping of a p-type conductivity dopant, the substrate comprising a second bulk region having a blanket doping of an n-type conductivity dopant;

growing field oxide regions in portions of the first and second bulk substrate regions, and defining active area regions in other portions of the first and second substrate regions;

in the same masking step, masking active area regions of the first bulk substrate region while leaving grown field oxide regions of the first bulk substrate region unmasked and masking grown field oxide regions of the second bulk substrate region while leaving select active area regions of the second bulk substrate region unmasked; and in the same ion implanting step, ion implanting p-type conductivity type impurity through the unmasked portions of the first and second bulk substrate regions to simultaneously form channel stop isolation implants beneath the unmasked grown field oxide regions in the first bulk substrate region and electrically conductive active area implants in the unmasked select active area regions of the second bulk substrate region.

In yet another alternate embodiment, a semiconductor processing method of providing dopant impurity into a semiconductor substrate comprises the following sequential steps:

providing a semiconductor substrate, the substrate comprising a first bulk region having a blanket doping of a p-type conductivity dopant, the substrate comprising a second bulk region having a blanket doping of an n-type conductivity type dopant;

in the same masking step, masking first regions of the first bulk substrate region while leaving second regions of the first bulk substrate region unmasked and masking first regions of the second bulk substrate region while leaving second regions of the second bulk substrate region unmasked;

in the same ion implanting step, ion implanting p-type conductivity impurity through the unmasked portions of the first and second bulk substrate regions to simultaneously form channel stop isolation implants in the unmasked second regions in the first bulk substrate region and electrically conductive p-type active area implants in the unmasked second regions of the second bulk substrate region; and growing field oxide in the second regions of the first bulk substrate region, and in the first regions of the second bulk substrate regions.

More particularly and first with reference to FIG. 1, a semiconductor substrate is indicated generally with reference numeral 10. Such comprises a first bulk region 12 having a blanket doping of a first conductivity type dopant. Substrate 10 also includes a second bulk region 14 having a blanket doping of a second conductivity type. In the illustrated and described embodiment, the first conductivity type is p while the second conductivity type is n. These conductivity types could be reversed without departing from the principles and scope of the invention which is defined by the accompanying claims appropriately interpreted in accordance with the doctrine of equivalents. Example dopant concentrations for p substrate region 12 would be $5 \times 10^{14} – 5 \times 10^{15}$ atoms/cm$^3$, while an example n-type dopant concentration for region 14 would be $1 \times 10^{15} – 5 \times 10^{16}$ atoms/cm$^3$.

For purposes of the continuing discussion, field oxide regions "F1", "F" and "F2" are defined in first bulk substrate region 12 and second bulk substrate region 14. Region F overlaps regions 12 and 14. Also, active area regions "A1" and "A2" are defined in first bulk substrate region 12 and second bulk substrate region 14. Further, the illustrated field oxide regions define or comprise birds beak edge regions "B". Further, within the illustrated active area regions "A1" and "A2" are defined channel regions "C".

Figure 2:
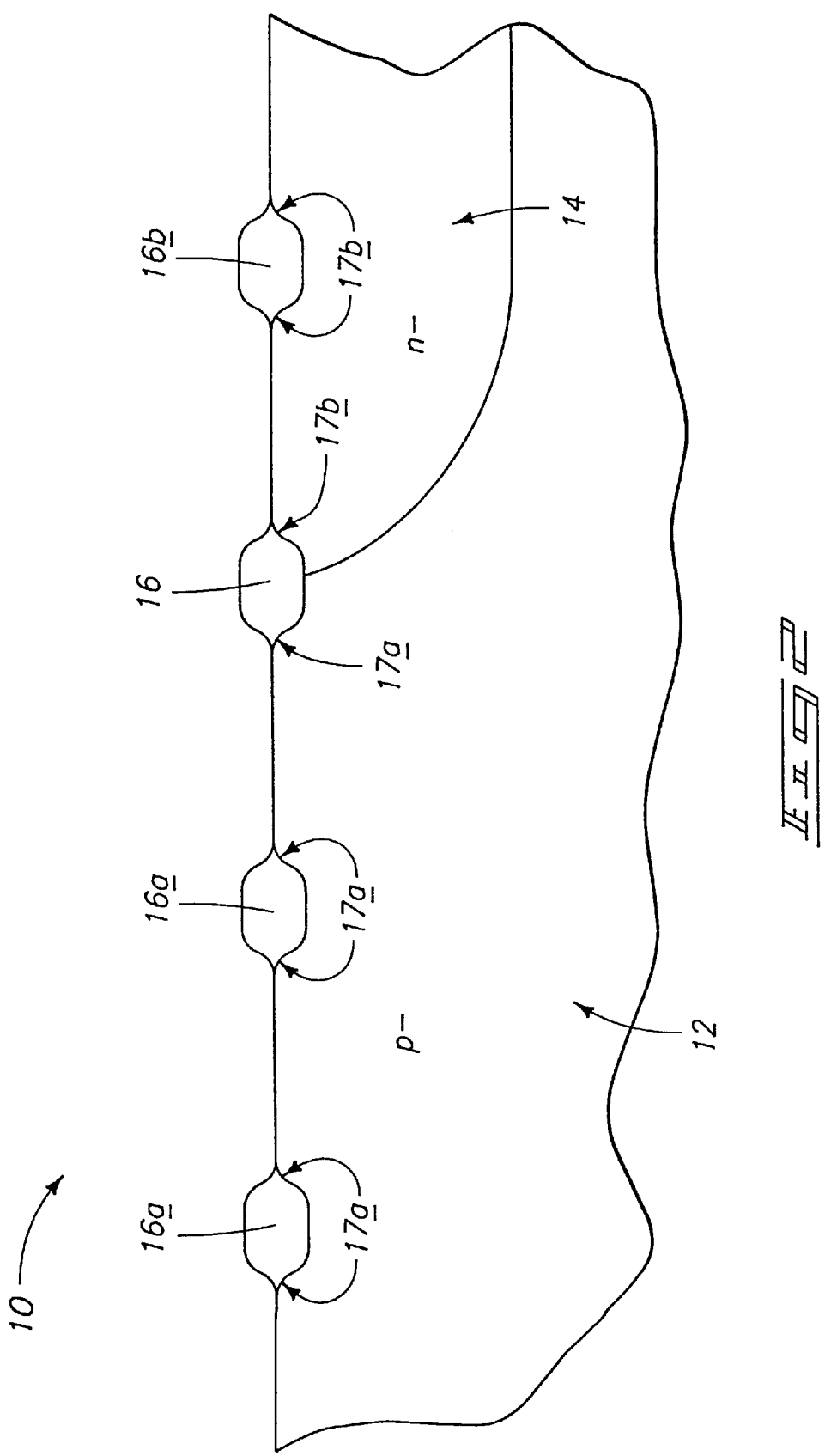
FIG. 2 is a view of the FIG. 1 wafer at a processing step subsequent to that shown by FIG. 1.

Referring to FIG. 2, the substrate is masked and conventional local oxidation of silicon (LOCOS) conducted to provide grown field oxide regions 16a, 16 and 16b, with birds beak regions 17a and 17b, in portions of first bulk substrate region 12 and second bulk substrate region 14. This further defines active area regions therebetween in other portions of the first and second substrate regions.

Figure 3:
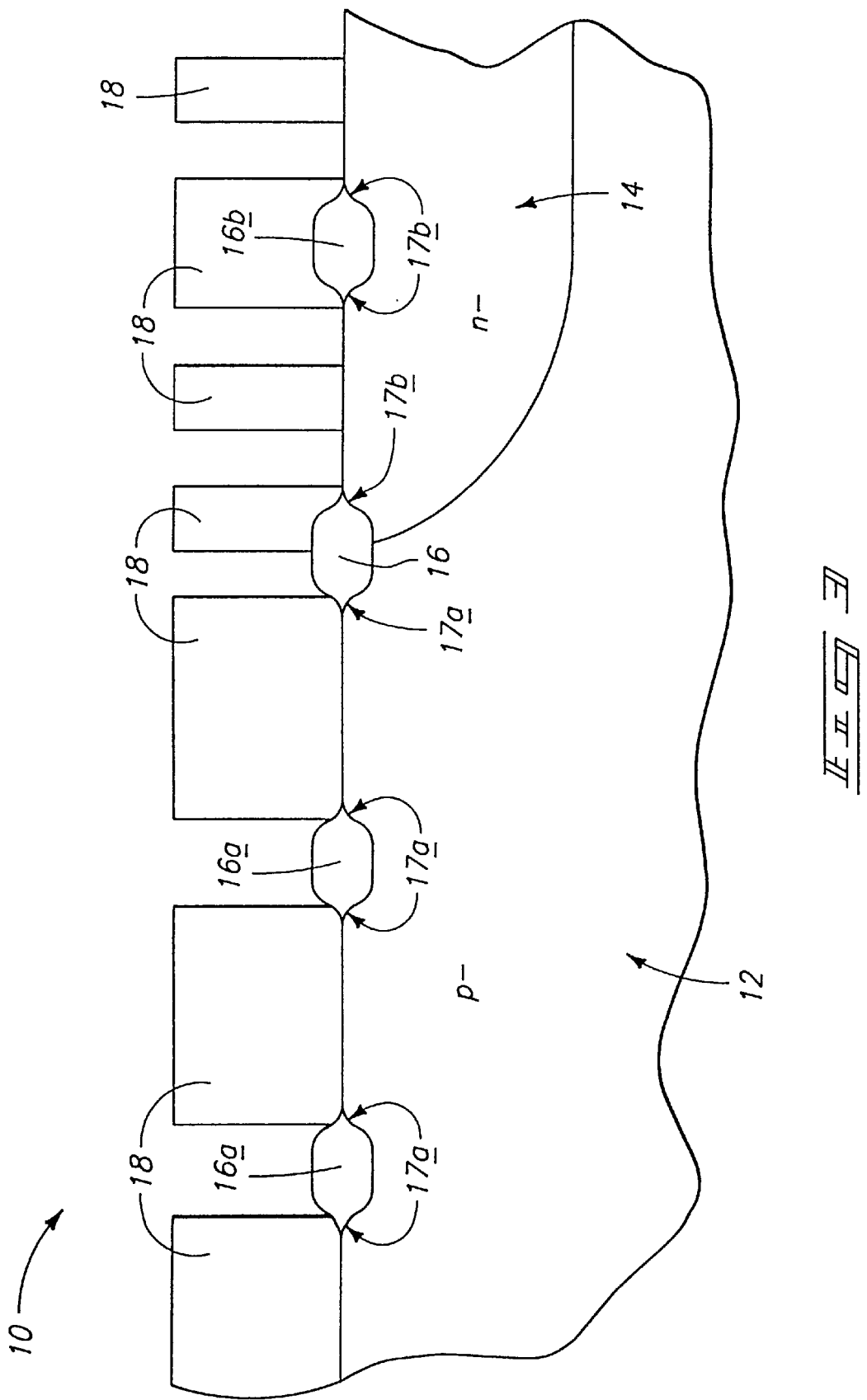
FIG. 3 is a view of the FIG. 1 wafer shown at a processing step subsequent to that shown by FIG. 2.

Referring to FIG. 3 and in a single masking step, a masking layer 18 is deposited and patterned as shown to mask the intervening active area regions and bird beaks 17a and 17b. Layer 18 leaves other portions of grown field oxide regions 16a of first bulk substrate region 12 unmasked, and masks grown field oxide regions 16b of second bulk substrate region 14 while leaving portions of the active area region within region 14 unmasked. Additionally, birds beak regions 17b in second active region 14 are masked by masking material 18.

Figure 4:
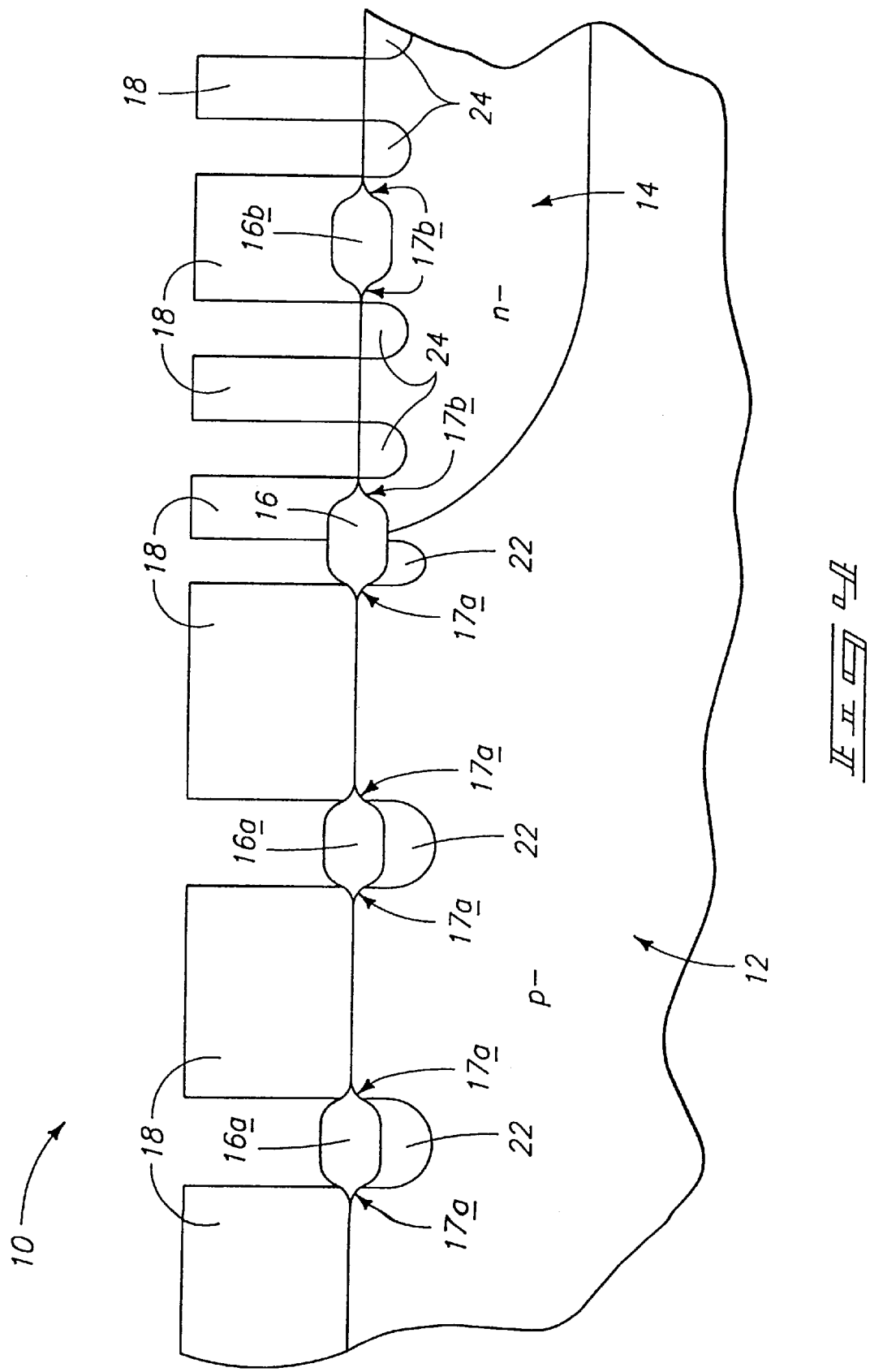
FIG. 4 is a view of the FIG. 1 wafer shown at a processing step subsequent to that shown by FIG. 3.

Referring to FIG. 4, in the same ion implanting step, p-type conductivity type impurity is ion implanted through the unmasked portions of the first and second bulk substrate regions 12 and 14, respectively, to simultaneously form p-type channel stop isolation implants 22 beneath unmasked portions of grown field oxide regions 16a, 16 and 16b, and electrically conductive active area implants 24 in unmasked active area regions of second bulk substrate region 14.

Figure 5:
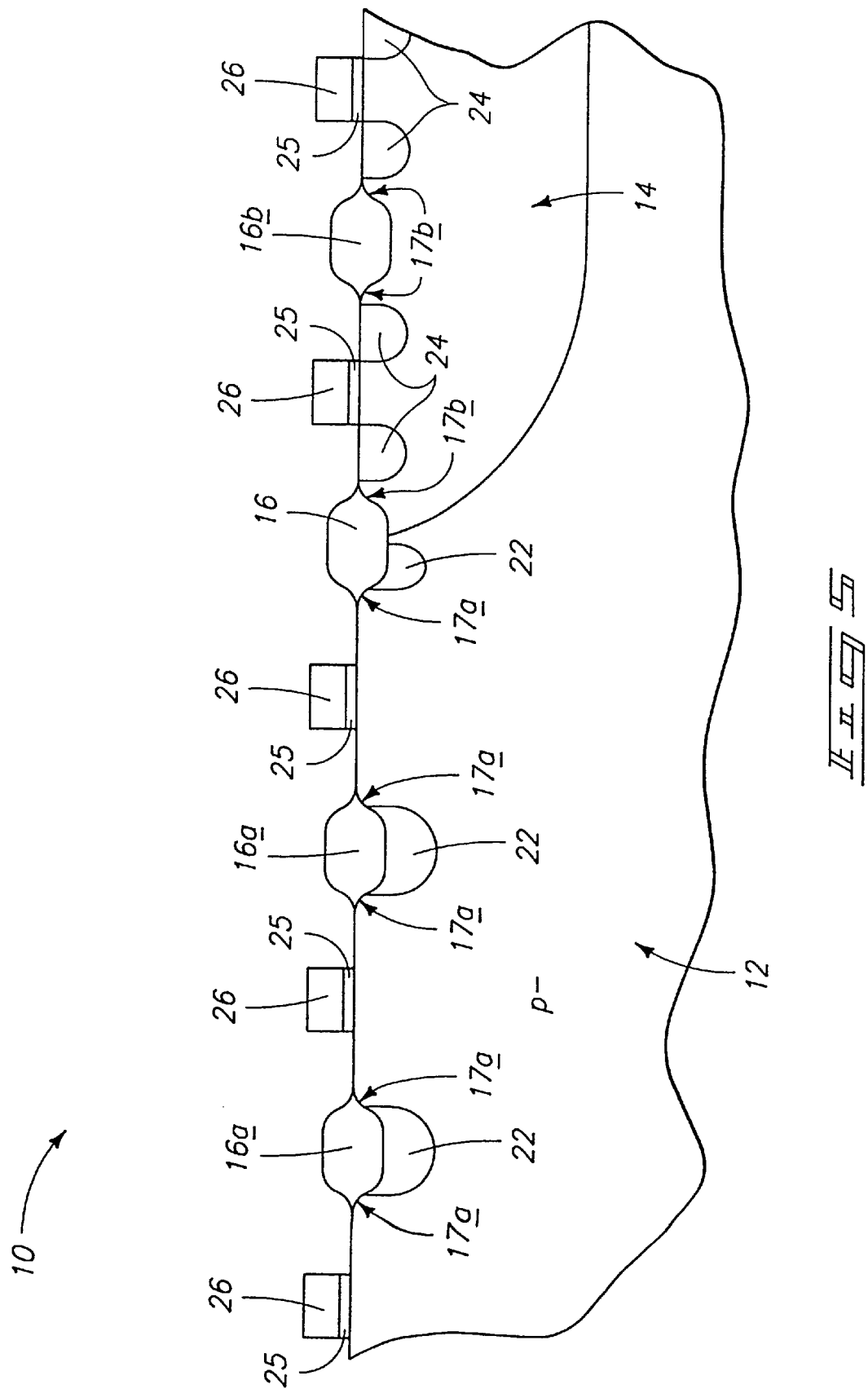
FIG. 5 is a view of the FIG. 1 wafer shown at a processing step subsequent to that shown by FIG. 4.

Referring to FIG. 5, definition of the channel regions is completed by formation of gate oxide 25 and overlying patterned polysilicon gates 26. In the illustrated embodiment where only an enlarged fragment of the wafer is shown, every transistor active area in region 14 is shown as being selected to have the subject implant. Of course, less than all of the region 14 transistors to be formed could be provided the implant.

Figure 6:
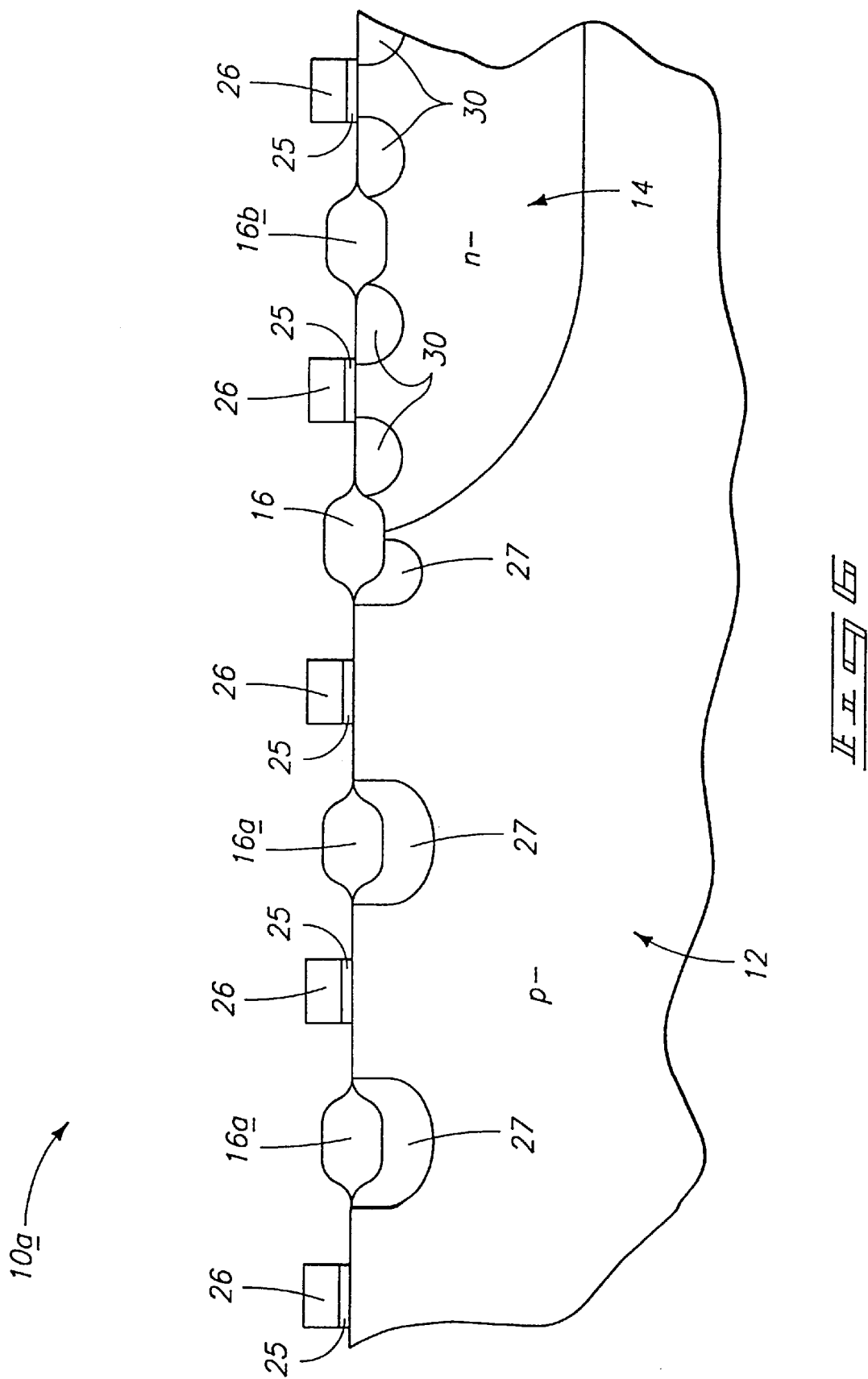
FIG. 6 is a diagrammatic sectional view of an alternate embodiment wafer fragment at one processing step in accordance with the invention.

FIG. 6 illustrates an alternate embodiment semiconductor wafer fragment 10a. Construction with the first described embodiment is the same, but for modified channel stop isolation implants 27 and active area implants 30. The common masking step to produce these regions in this embodiment leaves the birds beak regions of the field oxide regions unmasked such that ion implanting is conducted through these regions, at least in the second bulk substrate region, to position a portion of the illustrated active area implants beneath those bird beak regions. Further, the common masking step leaves opposing edge portions of the second bulk substrate channel regions unmasked. Thus, the ion implanting step is conducted through edge portions of the channel regions in the second bulk substrate region 14 to position a portion of active area implants 30 beneath the channels in second bulk substrate region 14. Such overlap provides for increased active area volume for transistors in the second bulk substrate region, and accommodates for misalignment of the common mask.

Figure 7:
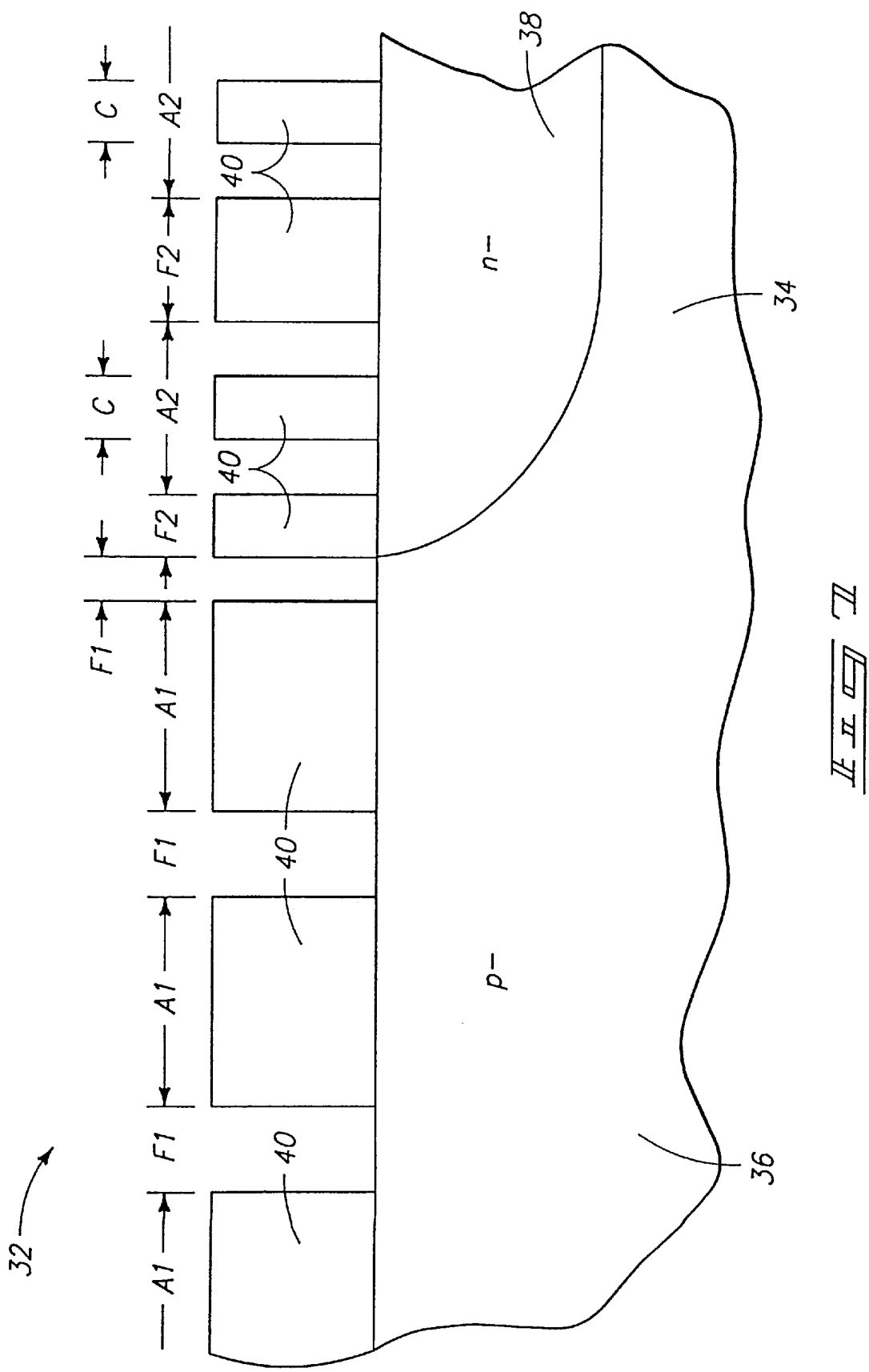
FIG. 7 is a diagrammatic sectional view of still another alternate embodiment wafer fragment at another processing step in accordance with the invention.

Both of the above described embodiments comprise methods where the defining of the field oxide regions and active area regions essentially was conducted by growing field oxide regions before the ion implanting step. An alternate process where such field oxide growth occurs after the ion implanting step is described with reference to FIGS. 7–10. Referring first to FIG. 7, a semiconductor wafer fragment at one process in accordance with this aspect of the invention is indicated with reference numeral 32. Such comprises a bulk semiconductor substrate 34 having a first bulk substrate region 36 and second bulk substrate region 38. Like the first described embodiment, first bulk substrate region is doped with p-type dopant impurity, while second substrate region 38 is doped with n-type dopant material.

A layer of masking material 40 is deposited and patterned, as shown. Masking layer 40 masks defined first regions "A1" of first bulk substrate region 34 while leaving defined second regions "F1" of first bulk substrate region 36 unmasked. Layer 40 is also patterned to mask at least portions of defined "F2" regions and "A2" first regions of second bulk substrate region 38. Specifically, layer 40 is patterned to mask regions F2 and "C" in second substrate region 38, while leaving other illustrated portions which will become active area implant regions of A2 unmasked.

Figure 8:
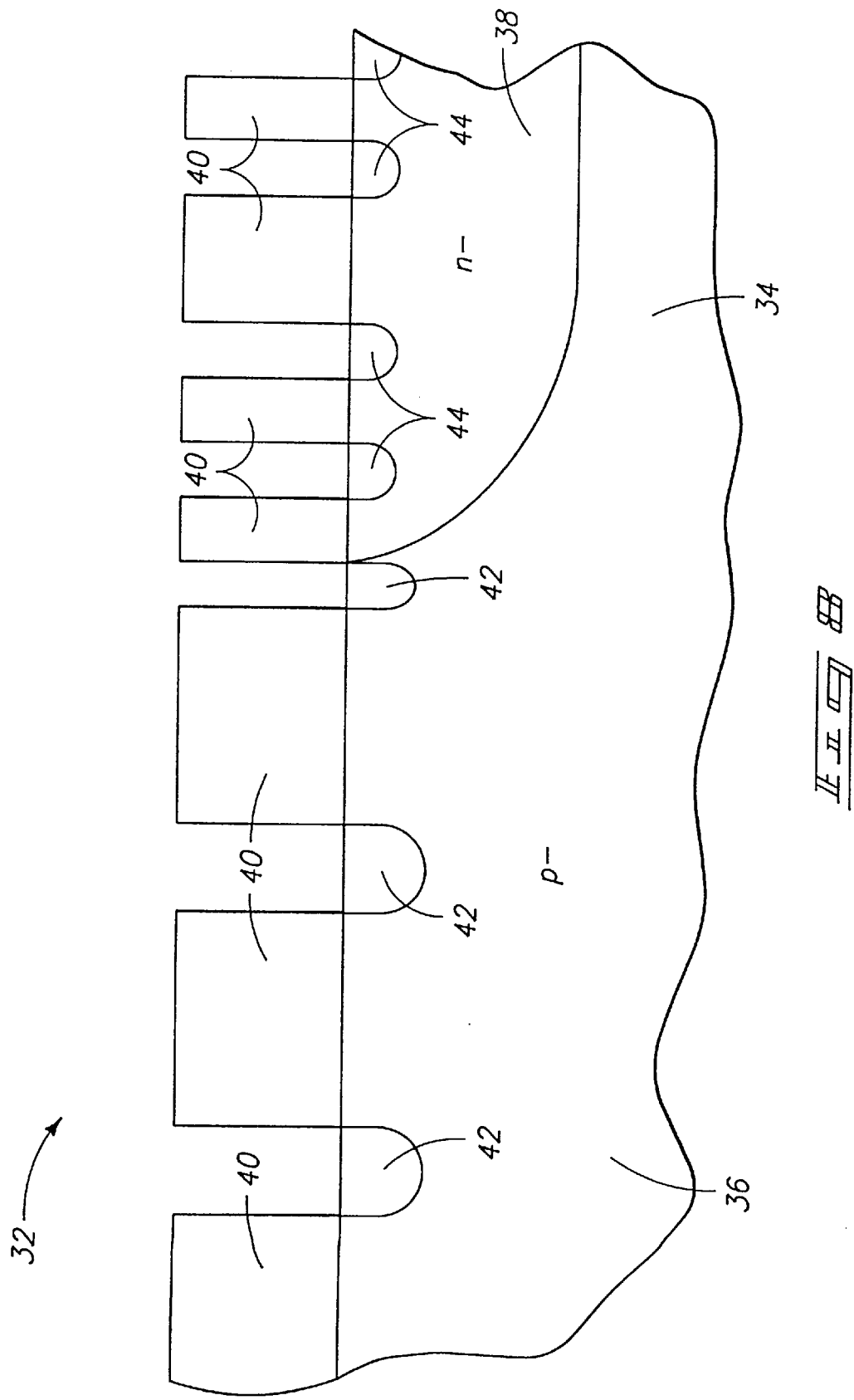
FIG. 8 is a view of the FIG. 7 wafer at a processing step subsequent to that shown by FIG. 7.

Referring to FIG. 8, ion implanting of p-type material in the same ion implanting step is conducted through the illustrated unmasked portions of first bulk substrate region 36 and second bulk substrate regions 38. This simultaneously forms channel stop isolation implants 42 in unmasked second regions in first bulk substrate region 36, and electrically conductive p-type active area implants 44 in unmasked second regions of second bulk substrate region 38.

Figure 9:
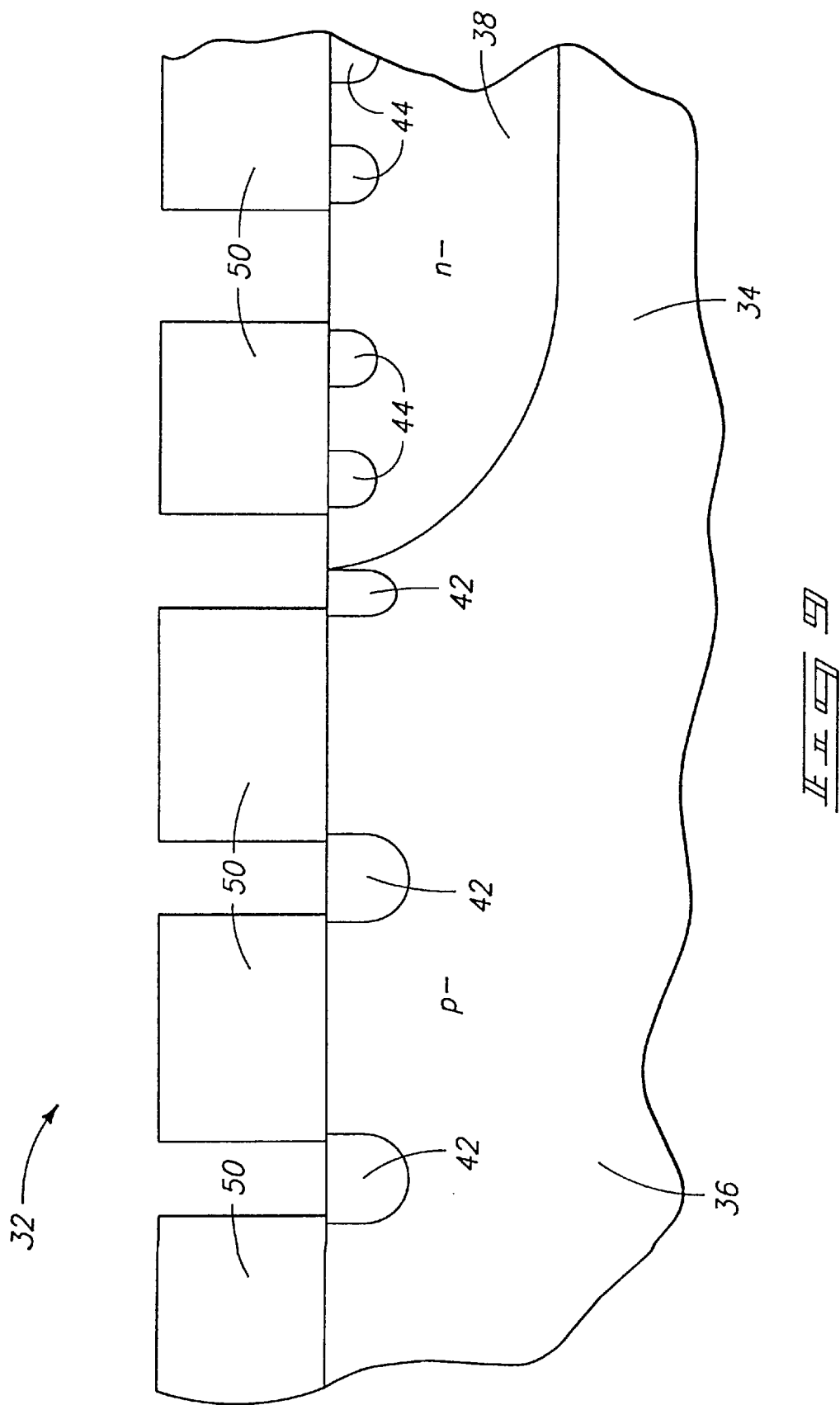
FIG. 9 is a view of the FIG. 7 wafer at a processing step subsequent to that shown by FIG. 8.

Referring to FIG. 9, masking layer 40 has been removed and a subsequent masking layer 50 deposited. Layer 50 is patterned as shown to cover all of those portions of first substrate region 36 and second substrate region 38 where field oxide is not to be grown.

Figure 10:
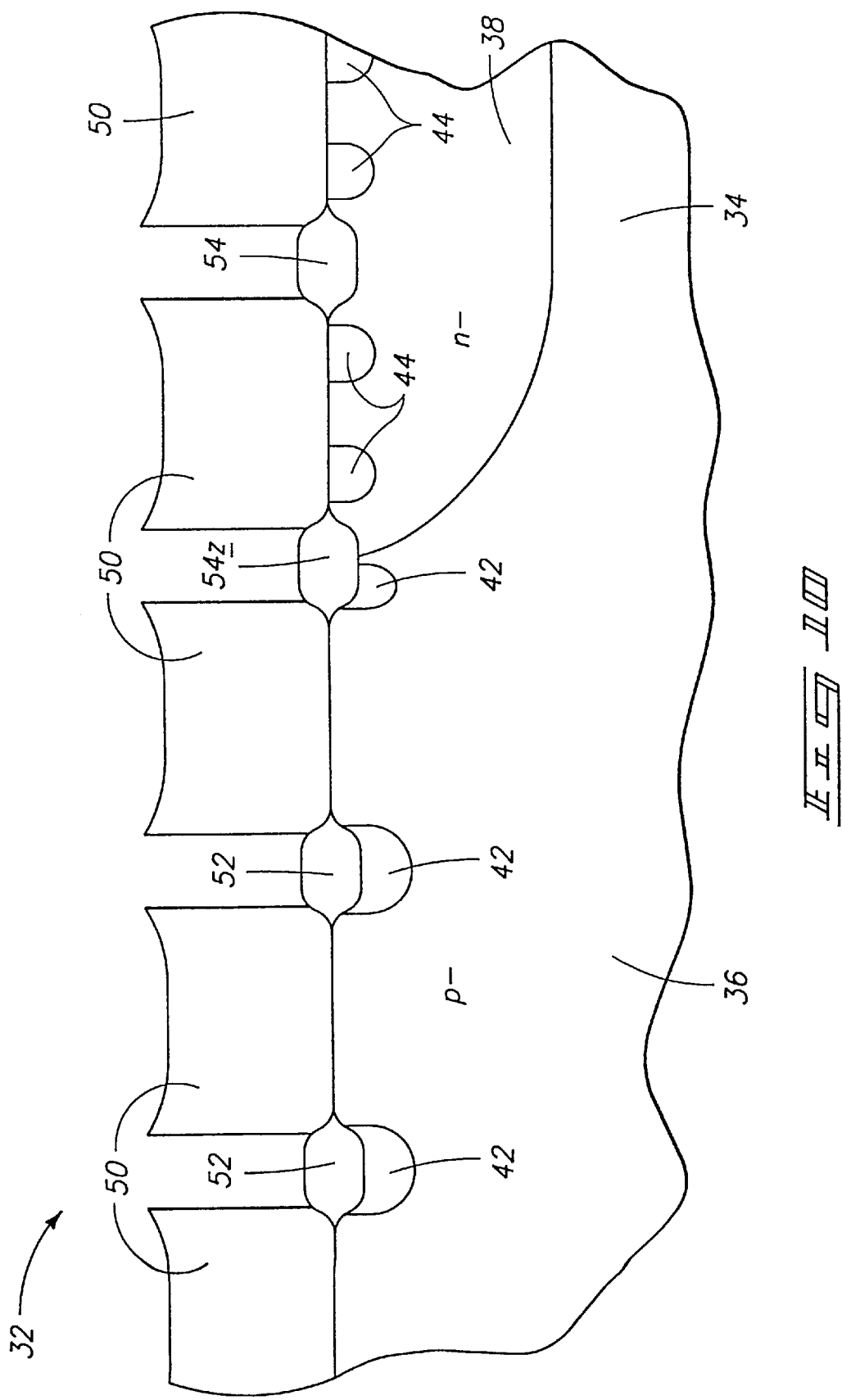
FIG. 10 is a view of the FIG. 7 wafer at a processing step subsequent to that shown by FIG. 9.

Referring to FIG. 10, the substrate is subjected to standard local oxidation of silicon (LOCOS) to grow field oxide regions 52 in second regions of first bulk substrate region 36 and grow field oxide regions 54 in first regions of second bulk substrate region 38. A field oxide region 54z overlaps regions 36 and 38.

Referring to FIG. 11, masking layer 50 is removed and gate oxide regions 25 and gate/word lines 26 provided as shown. Alternate masking prior to implant could also be conducted to position the illustrated implants to overlap with the bird beaks region as described above with respect to the first described embodiment.

The illustrated implants are preferably conducted to provide a peak concentration depth of 0.35–0.45 micron, and an average dopant impurity concentration of $10^{16}$–$10^{18}$ atoms/cm$^3$. These areas are subsequently activated by high temperature processing associated with typical remaining thermal processing steps, such as gate oxidation and BPSG reflow.

The implants of the above process provide a less abrupt pn junction, thus providing higher breakdown voltage. The deeper and more gradual pn junction increases the reverse bias depletion region width, thereby reducing the electric field for a given reverse bias voltage. The lower electric field in the semiconductor for a given voltage increases the breakdown voltage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

providing a semiconductor substrate comprising two substrate regions having different conductivity type background dopings from one another;

defining field oxide regions and active area regions in each of the two substrate regions; and simultaneously forming channel stop implants in one substrate region and electrically conductive active area implants in the other substrate region.

2. The method of claim 1 further comprising, after the simultaneously forming, providing gates over the active area regions of at least one of the substrate regions.

3. The method of claim 1 wherein the simultaneously forming comprises a masking and doping step wherein a mask is provided over selected field oxide regions and active area regions, and dopant is implanted into unmasked regions.

4. A semiconductor processing method comprising:

providing a semiconductor substrate having an n-type region and p-type region, and having field oxide over the n-type and p-type regions;

defining active area regions in each of the n-type and p-type substrate regions;

simultaneously forming channel stop isolation implants beneath field oxide in one of the n-type and p-type substrate regions and electrically conductive active area implants in the active area regions of the other of the n-type and p-type regions; and wherein the field oxide regions comprise birds beak regions, the simultaneously forming channel stop isolation implants and electrically conductive active area implants also positioning a portion of the active area implants beneath birds beak regions in said other of the n-type and p-type regions.

5. The method of claim 4 wherein the simultaneously forming comprises a masking and doping step wherein a mask is provided over selected field oxide regions and active area regions, and dopant is implanted into unmasked regions.

6. The method of claim 4 wherein said one of the n-type and p-type regions is the p-type region.

7. The method of claim 4 wherein said one of the n-type and p-type regions is the n-type region.

8. A semiconductor processing method of providing dopant impurity into a semiconductor substrate comprising the following steps:

providing a semiconductor substrate, the substrate comprising two regions, one of the regions being a first region having a blanket doping of a first type conductivity enhancing dopant, the other region being a second region having a blanket doping of a second type conductivity enhancing dopant;

defining field oxide regions in each of the first and second regions defining active area regions between the field oxide regions;

masking active area regions of the first region while leaving field oxide regions of the first region unmasked, and masking field oxide regions of the second region while leaving at least some active area regions of the second region unmasked;

doping through the unmasked portions of the two regions;

wherein the field oxide regions comprise birds beak regions, the masking leaving at least portions of the birds beak regions unmasked, the doping comprising doping through birds beak regions in the second region to position a portion of the active area implants beneath birds beak regions in the second region; and after the doping, providing gates over the active area regions of the first and second regions, the gates comprising patterned polysilicon.

* * * * *